United States Patent
Yama

(10) Patent No.: US 8,232,143 B2
(45) Date of Patent: *Jul. 31, 2012

(54) DEVICE FORMED USING A HARD MASK AND ETCH STOP LAYER

(75) Inventor: Gary Yama, Mountain View, CA (US)

(73) Assignee: Robert Bosch GmbH, Stuttgart (DE)

( * ) Notice: Subject to any disclaimer, the term of this patent is extended or adjusted under 35 U.S.C. 154(b) by 0 days.

This patent is subject to a terminal disclaimer.

(21) Appl. No.: 13/171,112

(22) Filed: Jun. 28, 2011

(65) Prior Publication Data

US 2011/0254020 A1    Oct. 20, 2011

Related U.S. Application Data

(63) Continuation of application No. 12/006,377, filed on Dec. 31, 2007, now Pat. No. 7,981,308.

(51) Int. Cl.
*H01L 21/44* (2006.01)

(52) U.S. Cl. ........................................ 438/118; 438/622

(58) Field of Classification Search .................. 438/118, 438/622
See application file for complete search history.

(56) References Cited

U.S. PATENT DOCUMENTS

| | | | |
|---|---|---|---|
| 6,245,640 B1 | 6/2001 | Claussen et al. | |
| 6,455,409 B1 | 9/2002 | Subramanian et al. | |
| 6,521,533 B1 | 2/2003 | Morand et al. | |
| 6,720,249 B1 | 4/2004 | Dalton et al. | |
| 6,930,036 B2 | 8/2005 | Usami | |
| 7,151,277 B2 | 12/2006 | Gao et al. | |
| 7,169,708 B2 | 1/2007 | Inukai | |
| 7,981,308 B2 * | 7/2011 | Yama ............................ 216/79 |
| 2002/0142586 A1 | 10/2002 | Shiota | |
| 2004/0035825 A1 | 2/2004 | Nakamura et al. | |
| 2004/0166666 A1 | 8/2004 | Usami | |
| 2004/0198037 A1 | 10/2004 | Iba | |
| 2004/0227247 A1 | 11/2004 | Chooi et al. | |
| 2005/0170625 A1 | 8/2005 | Cong et al. | |
| 2005/0272265 A1 | 12/2005 | Geffken et al. | |
| 2005/0287811 A1 | 12/2005 | Inukai | |
| 2006/0003577 A1 | 1/2006 | Sone | |
| 2006/0145348 A1 | 7/2006 | Shimizu et al. | |
| 2006/0228848 A1 | 10/2006 | Chan et al. | |
| 2007/0056927 A1 | 3/2007 | Tsou et al. | |

FOREIGN PATENT DOCUMENTS

| | | |
|---|---|---|
| DE | 1984410 U | 4/1968 |
| JP | 10056080 A | 2/1998 |
| JP | 2006134941 A | 5/2006 |
| KR | 20060019886 | 3/2003 |
| KR | 20040001459 | 1/2004 |
| TW | 473924 B | 1/2002 |
| WO | 2004111069 | 12/2004 |

* cited by examiner

*Primary Examiner* — Samuel Gebremariam
(74) *Attorney, Agent, or Firm* — Maginot, Moore & Beck

(57) ABSTRACT

A method of etching a device in one embodiment includes providing a silicon carbide substrate, forming a silicon nitride layer on a surface of the silicon carbide substrate, forming a silicon carbide layer on a surface of the silicon nitride layer, forming a silicon dioxide layer on a surface of the silicon carbide layer, forming a photoresist mask on a surface of the silicon dioxide layer, and etching the silicon dioxide layer through the photoresist mask.

11 Claims, 3 Drawing Sheets

DEVICE FORMED USING A HARD MASK AND ETCH STOP LAYER

This application is a continuation of prior application Ser. No. 12/006,377, filed Dec. 31, 2007.

FIELD OF THE INVENTION

This invention relates to fabrication processes for semiconductor devices.

BACKGROUND

Silicon carbide (SiC) has a large energy band gap and high breakdown field. As such, SiC is an attractive material for electronic devices operating at high temperatures and high power. SiC also exhibits mechanical properties and chemical inertness which are useful in micro-electromechanical systems (MEMS) as well as nano-electromechanical systems (NEMS) for applications in harsh environments. SiC based devices are therefore particularly attractive for use as high-temperature sensors and actuators.

Additionally, SiC has a high acoustic velocity and extremely stable surfaces. Thus, SiC is a promising structural material for fabricating ultra-high frequency micromechanical signal processing systems. The highly stable physicochemical properties of SiC also improve the performance of high-frequency resonators as the surface-to-volume ratio increases when the resonator frequency scales into the GHz ranges.

One of the challenges in fabricating SiC devices is related to the selective etching of SiC films or SiC bulk materials. Unlike silicon (Si), SiC is not etched significantly by most acids and bases at temperatures less than about 600° C. Most wet etching processes, however, are not easily effected at temperatures greater than about 600° C. Non-standard techniques such as laser-assisted photo-electrochemical etching have been developed, but such techniques require special equipment and exhibit poor lateral dimension control.

Traditional fabrication processes incorporating photoresist etch masks are also problematic. Primary etch gasses that are used in SiC etching include chlorine ($Cl_2$) and hydrogen bromide (HBr). The photoresist material, however, exhibits poor selectivity compared to SiC when exposed to traditional etch gases.

What is needed is a method of manufacturing a device incorporating a masking material which exhibits increased selectivity compared with traditional masking materials. What is further needed is a method of manufacturing a device incorporating a masking material which exhibits increased selectivity when exposed to traditional SiC etching gases.

SUMMARY

In accordance with one embodiment of the present invention, there is provided a method of etching a device that includes providing a silicon carbide substrate, forming a silicon nitride layer on a surface of the silicon carbide substrate, forming a silicon carbide layer on a surface of the silicon nitride layer, forming a silicon dioxide layer on a surface of the silicon carbide layer, forming a photoresist mask on a surface of the silicon dioxide layer, and etching the silicon dioxide layer through the photoresist mask.

In accordance with another embodiment of the present invention, there is provided a method of etching a semiconductor device including providing a substrate, forming an etch stop layer on a surface of the substrate, forming a silicon carbide layer on a surface of the etch stop layer, forming a hard mask layer on a surface of the silicon carbide layer, forming a photoresist mask on the hard mask layer, and etching the silicon carbide layer through the hard mask layer and the photoresist mask.

DESCRIPTION

Figure 1:
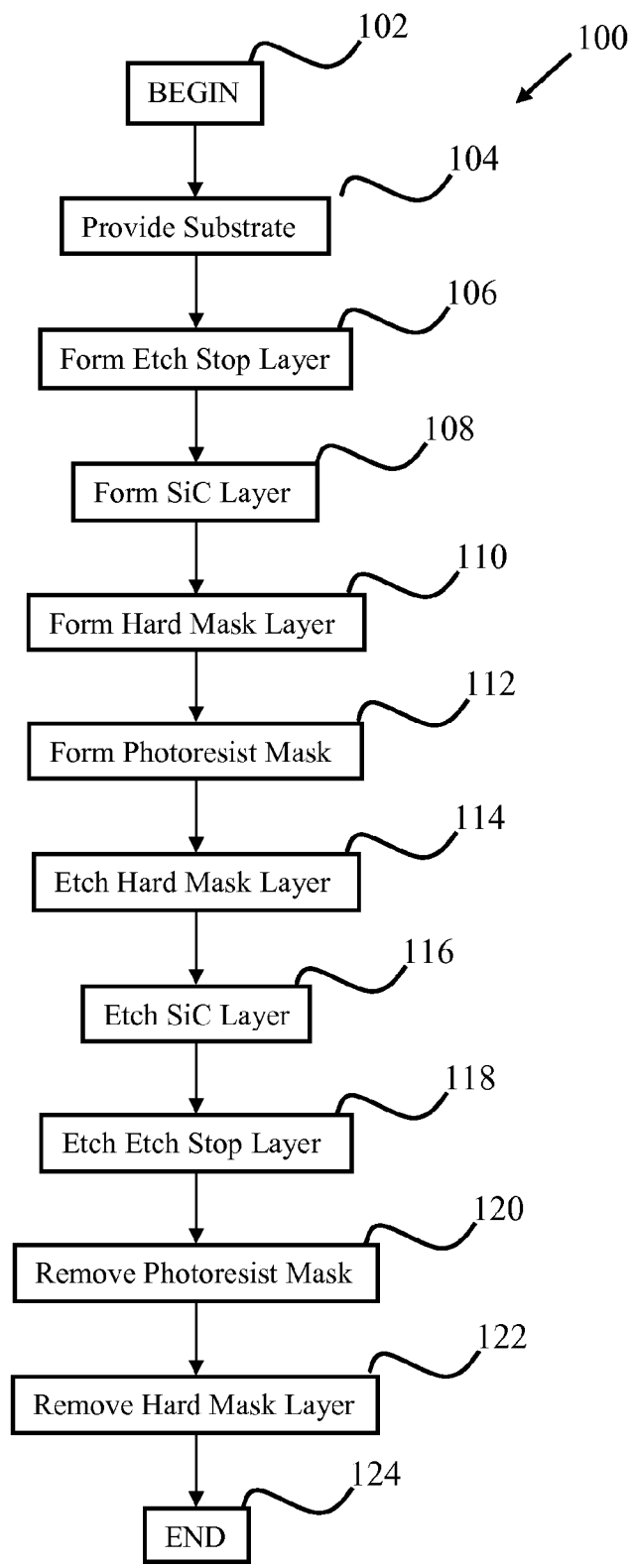
FIG. 1 shows a flow chart of an SiC etching portion of a process for manufacturing a device in accordance with principles of the present invention.
Figure 2:
FIG. 2 shows a cross-sectional view of a substrate, which in this embodiment is a SiC substrate, which may be used in a device in accordance with principles of the present invention.

For the purposes of promoting an understanding of the principles of the invention, reference will now be made to the embodiments illustrated in the drawings and described in the following written specification. It is understood that no limitation to the scope of the invention is thereby intended. It is further understood that the present invention includes any alterations and modifications to the illustrated embodiments and includes further applications of the principles of the invention as would normally occur to one skilled in the art to which this invention pertains.

FIG. 1 shows a flow chart 100 of SiC etching portion of a manufacturing process for a device in accordance with principles of the present invention. The process 100 of FIG. 1 begins at step 102 and a substrate is provided at 104. At step 106, an etch stop layer is formed on the surface of the substrate followed by formation of a SiC layer on the etch stop layer at the step 108. A hard mask is then formed on the SiC layer at step 110 and a photoresist mask is patterned on the hard mask at step 112.

Etching of the device begins with etching of the hard mask layer through the photoresist mask at the step 114. Next, the SiC layer is etched at the step 116 through the photoresist mask and the hard mask layer. The etch stop layer is then etched at the step 118.

When the desired etching is concluded, the photoresist mask is removed at the step 120 followed by the removal of the hard mask layer at the step 122. The process then ends at the step 124. After the process shown in FIG. 1 is complete, further processing of the device may be performed.

Figure 3:
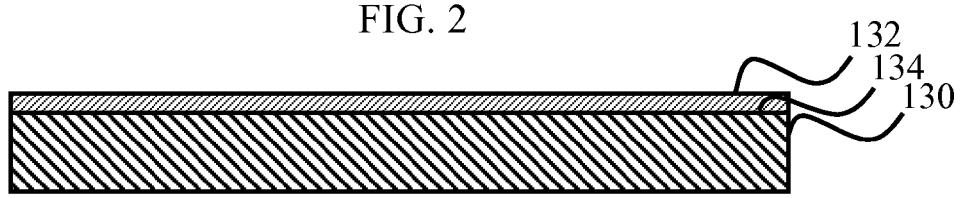
FIG. 3 shows a device including the substrate of FIG. 2 with an etch stop layer, which may include $Si_3N_4$, formed on the upper surface of the substrate.
Figure 4:
FIG. 4 shows the device of FIG. 3 with a SiC layer formed on the upper surface of the etch stop layer of FIG. 3.
Figure 5:
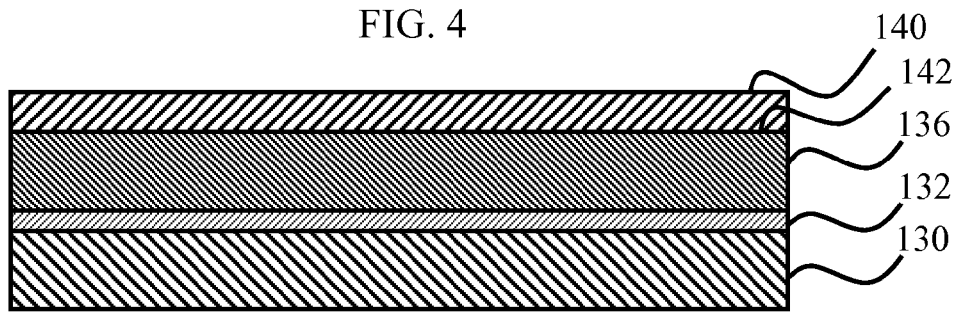
FIG. 5 shows the device of FIG. 4 with a hard mask layer, which in this embodiment includes $SiO_2$, formed on the SiC layer of FIG. 4.

One example of the process of FIG. 1 is shown in FIGS. 2-11. A substrate 130 is shown if FIG. 2. The substrate 130 may either be a SiC substrate or a substrate having a layer of SiC formed thereon. Next, FIG. 3 shows an etch stop layer 132 formed on the upper surface 134 of the substrate 130. The etch stop layer 132 preferably includes silicon nitride ($Si_3N_4$). Next, a layer 136 of SiC is formed on the upper surface 138 of the etch stop layer 132 as shown in FIG. 4 and a hard mask layer 140 is formed on the upper surface 142 of the SiC layer 136 as shown in FIG. 5. The hard mask layer 140 in this embodiment includes silicon dioxide ($SiO_2$).

Figure 6:
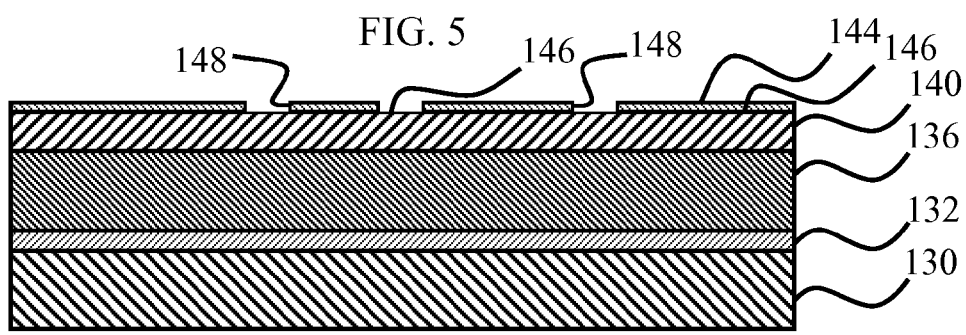
FIG. 6 shows the device of FIG. 5 with a photoresist mask formed on the upper surface of the hard mask layer of FIG. 5.

FIG. 6 shows a photoresist mask 144 in position on the upper surface 146 of the hard mask layer 140. The photoresist mask 144 may be patterned to include a number of openings 148. The openings 148 may be of any desired form such as circles, rectangles, etc. Portion of the upper surface 146 of the hard mask layer 140 are exposed through the openings 148.

Figure 7:
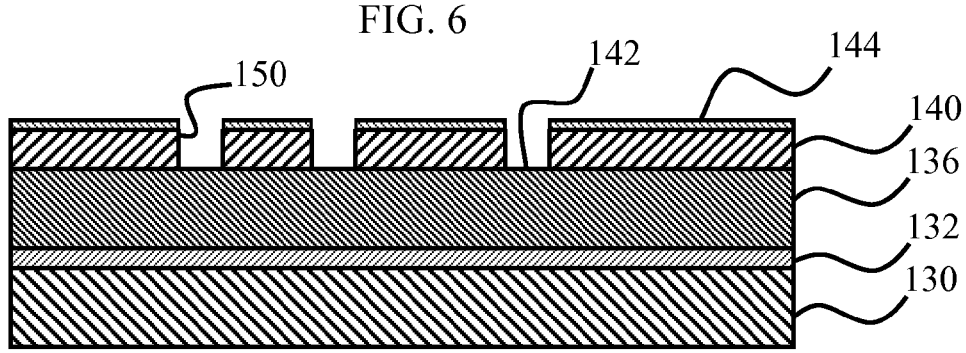
FIG. 7 shows the device of FIG. 6 with the hard mask layer etched beneath the openings of the photoresist mask to expose portions of the upper surface of the SiC layer in accordance with principles of the present invention.

Etching of the device may then be performed using an etching gas which preferably includes $Cl_2$, HBr or both $Cl_2$ and HBr. The etching gas contacts the hard mask layer 140 through the openings 148 thereby etching the material directly beneath the openings 148 and generating a via 150 through the hard mask layer 140 to expose the SiC layer 136 as shown in FIG. 7.

Figure 8:
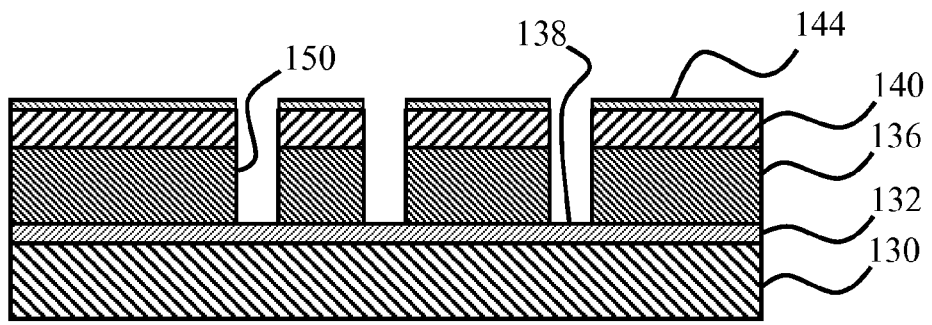
FIG. 8 shows the device of FIG. 7 with the SiC layer etched beneath the openings of the photoresist mask to expose portions of the upper surface of the etch stop layer in accordance with principles of the present invention.

Continued exposure to etching gases results in the etching of the SiC layer 136. The hard mask layer 140 is exposed to the etching gases about the vias 150. The SiC layer 136, however, is more rapidly etched by the etch gases than the material used to form the hard mask layer 140. In the embodiment of FIGS. 2-11, the selectivity ratio of the SiC layer to the $SiO_2$ hard mask layer is about 6:1. Accordingly, the predominant effect of the etch gas is to extend the via 150 through the SiC layer 136 to expose the upper surface 138 of the etch stop layer 132 as shown in FIG. 8.

Figure 9:
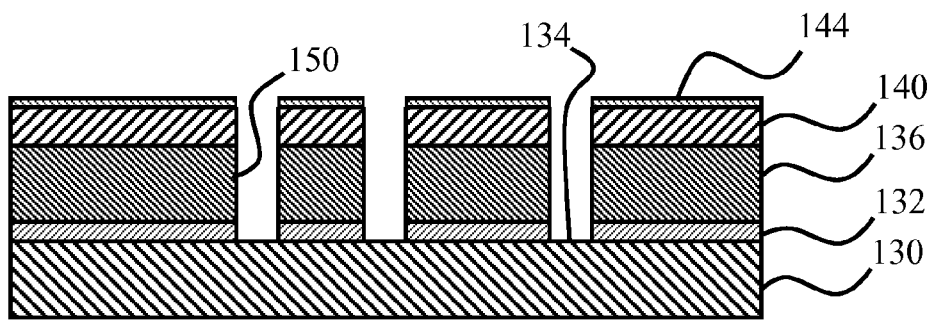
FIG. 9 shows the device of FIG. 8 with the etch stop layer etched beneath the openings of the photoresist mask to expose portions of the upper surface of the substrate in accordance with principles of the present invention.

Continued exposure to etching gases results in the etching of the etch stop layer 132. The selectivity ratio of SiC to the $Si_3N_4$ used in this embodiment is about 1.4:1. Accordingly, the via 150 widens as the etch stop layer 132 is etched, particularly in the SiC layer 136. Etching concludes when the upper surface 134 of the substrate 130 is exposed to the desired extent as shown in FIG. 9.

Figure 10:
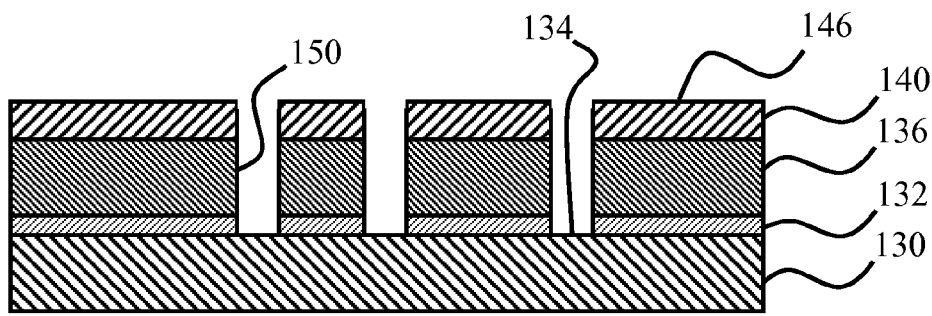
FIG. 10 shows the device of FIG. 9 with the remainder of the photoresist mask removed to expose the remainder of the upper surface of the hard mask layer in accordance with principles of the present invention.
Figure 11:
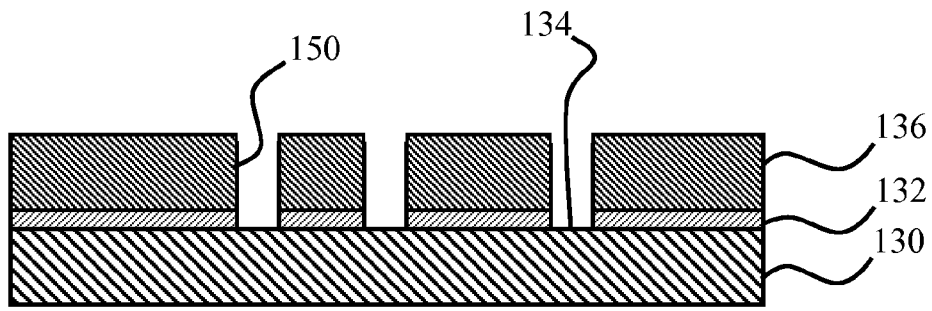
FIG. 11 shows the device of FIG. 10 with the remainder of the upper surface of the hard mask layer removed to expose the remainder of the upper surface of the SiC layer in accordance with principles of the present invention.

At this point, the photoresist mask 144 is no longer needed. Accordingly, any remnant of the photoresist mask 144 is removed using any desired process leaving the remainder of the upper surface 146 of the hard mask layer 140 exposed as shown in FIG. 10. The remainder of the hard mask layer 140 is likewise removed using any desired process leaving the remainder of the upper surface 142 of the SiC layer 136 exposed as shown in FIG. 11.

While the invention has been illustrated and described in detail in the drawings and foregoing description, the same should be considered as illustrative and not restrictive in character. It is understood that only the preferred embodiments have been presented and that all changes, modifications and further applications that come within the spirit of the invention are desired to be protected.

The invention claimed is:

1. A semiconductor device, formed by a process comprising:
   providing a silicon carbide substrate;
   forming a silicon nitride layer on a surface of the silicon carbide substrate;
   forming a silicon carbide layer on a surface of the silicon nitride layer;
   forming a silicon dioxide layer on a surface of the silicon carbide layer;
   forming a photoresist mask on a surface of the silicon dioxide layer; and
   etching the silicon dioxide layer through the photoresist mask using an etch gas which etches silicon carbide at a higher rate than silicon dioxide.

2. The device of claim 1, wherein etching the silicon dioxide layer through the photoresist mask comprises:
   etching the silicon dioxide layer through the photoresist mask with an etch gas which etches silicon carbide at a rate of at least about six times faster than silicon dioxide.

3. The device of claim 1, the process further comprising:
   etching the silicon carbide layer through the etched silicon dioxide layer.

4. The device of claim 3, wherein etching the silicon carbide layer comprises:
   etching the silicon carbide layer through the photoresist mask and through the etched silicon dioxide layer with an etch gas which etches silicon carbide at a rate of at least about six times faster than silicon dioxide.

5. The device of claim 3, the process further comprising:
   etching the silicon nitride layer through the etched silicon carbide layer.

6. The device of claim 5, wherein etching the silicon nitride layer comprises:
   etching the silicon nitride layer through the photoresist mask, the etched silicon dioxide layer and the etched silicon carbide layer with an etch gas which etches silicon carbide at a rate of at least about six times faster than silicon dioxide.

7. The device of claim 5, further comprising:
   removing the at least some of the photoresist mask after etching the silicon dioxide layer.

8. The device of claim 7, the method further comprising:
   removing the etched silicon dioxide layer.

9. A semiconductor device formed by a process comprising:
   providing a substrate;
   forming a silicon nitride etch stop layer on a surface of the substrate;
   forming a silicon carbide layer on a surface of the silicon nitride etch stop layer;
   forming a hard mask layer on a surface of the silicon carbide layer;
   forming a photoresist mask on the hard mask layer; and
   etching the silicon carbide layer through the photoresist mask using an etch gas which etches silicon carbide at a higher rate than silicon dioxide.

10. The device of claim 9, wherein forming a hard mask layer on a surface of the silicon carbide layer comprises:
    forming a silicon dioxide layer on a surface of the silicon carbide layer.

11. The device of claim 9, wherein etching the silicon carbide layer comprises:
    etching the silicon carbide layer through the photoresist mask with an etch gas which etches silicon carbide at a rate of at least about six times faster than silicon dioxide.

* * * * *